(12) United States Patent
Daiber et al.

(10) Patent No.: US 7,468,996 B2
(45) Date of Patent: Dec. 23, 2008

(54) EXTERNAL CAVITY LASER TUNING ELEMENT DITHER SERVO CONTROL

(75) Inventors: Andrew Daiber, Emerald Hills, CA (US); Anand S. Ramalingam, Newark, CA (US); Jiann-Chang Lo, Cupertino, CA (US); Douglas A. Sprock, Newark, CA (US); William B. Chapman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/647,783

(22) Filed: Dec. 29, 2006

(65) Prior Publication Data

US 2008/0159340 A1 Jul. 3, 2008

(51) Int. Cl.
*H01S 3/10* (2006.01)
(52) U.S. Cl. .................. 372/20; 372/25; 372/29.014
(58) Field of Classification Search .................. 372/20, 372/25, 29.014
See application file for complete search history.

(56) References Cited

U.S. PATENT DOCUMENTS

| 6,600,760 | B1 | 7/2003 | Green et al. |
| 6,631,146 | B2 | 10/2003 | Pontis et al. |
| 6,661,815 | B1 * | 12/2003 | Kozlovsky et al. ............ 372/20 |
| 6,917,632 | B2 | 7/2005 | Koller et al. |
| 6,927,377 | B2 | 8/2005 | Chapman |
| 6,940,881 | B2 | 9/2005 | Pontis et al. |

* cited by examiner

*Primary Examiner*—Dung T Nguyen
(74) *Attorney, Agent, or Firm*—Blakely, Sokoloff, Taylor & Zafman LLP

(57) ABSTRACT

According to embodiments of the present invention, an external cavity laser includes one or more tuning elements. At least one modulated voltage signal or dither is used to lock the transmission peak of the two tuning elements to each other. The wavelength of the laser also may lock onto the lock transmission peaks. In embodiments in which two dither signals are used, the dither signals may be orthogonal to or independent of each other. The two dither signals may produce two control signals to align the transmission peak of one filter to the transmission peak of another filter and the lasing mode of the laser to the aligned filters.

18 Claims, 9 Drawing Sheets

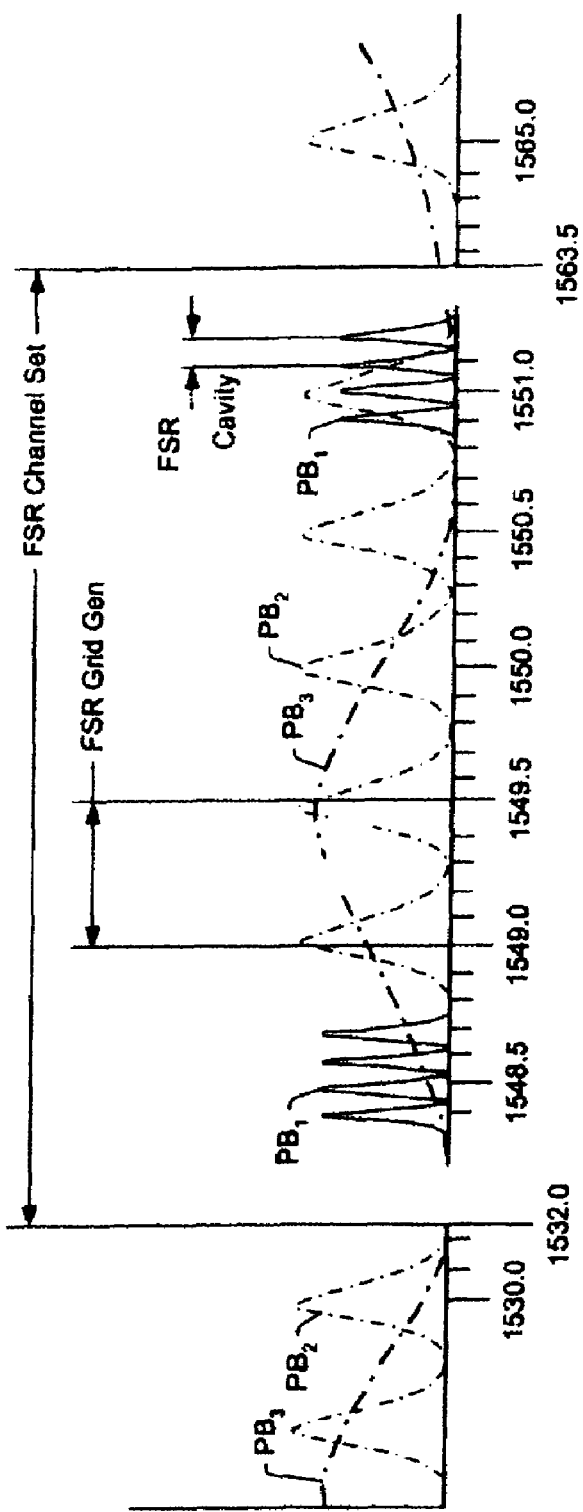
FIG. 4
FIG. 6
FIG. 5

1100

EXTERNAL CAVITY LASER TUNING ELEMENT DITHER SERVO CONTROL

BACKGROUND

1. Field

Embodiments of the present invention relate to optical devices and, in particular, to external cavity lasers.

2. Discussion of Related Art

In general, tunable optical devices, such as tunable external cavity lasers, may be used in a variety of telecommunications applications to take advantage of the bandwidth offered by optical fibers and dense wavelength division multiplexing (DWDM) technology. Traditional tunable external cavity lasers have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 4 is graphical representations illustrating the pass band relationship of the two filters and the external cavity of the tunable external cavity laser depicted in FIG. 1 according to an embodiment of the present invention;

FIG. 5 is a graphical representation illustrating a filter selecting a lasing mode according to an embodiment of the present invention;

FIG. 6 is a graphical representation illustrating one filter in a laser cavity selecting a transmission peak from a pass band generated by another filter in the laser cavity according to an embodiment of the present invention

DETAILED DESCRIPTION OF EMBODIMENTS

Figure 1:
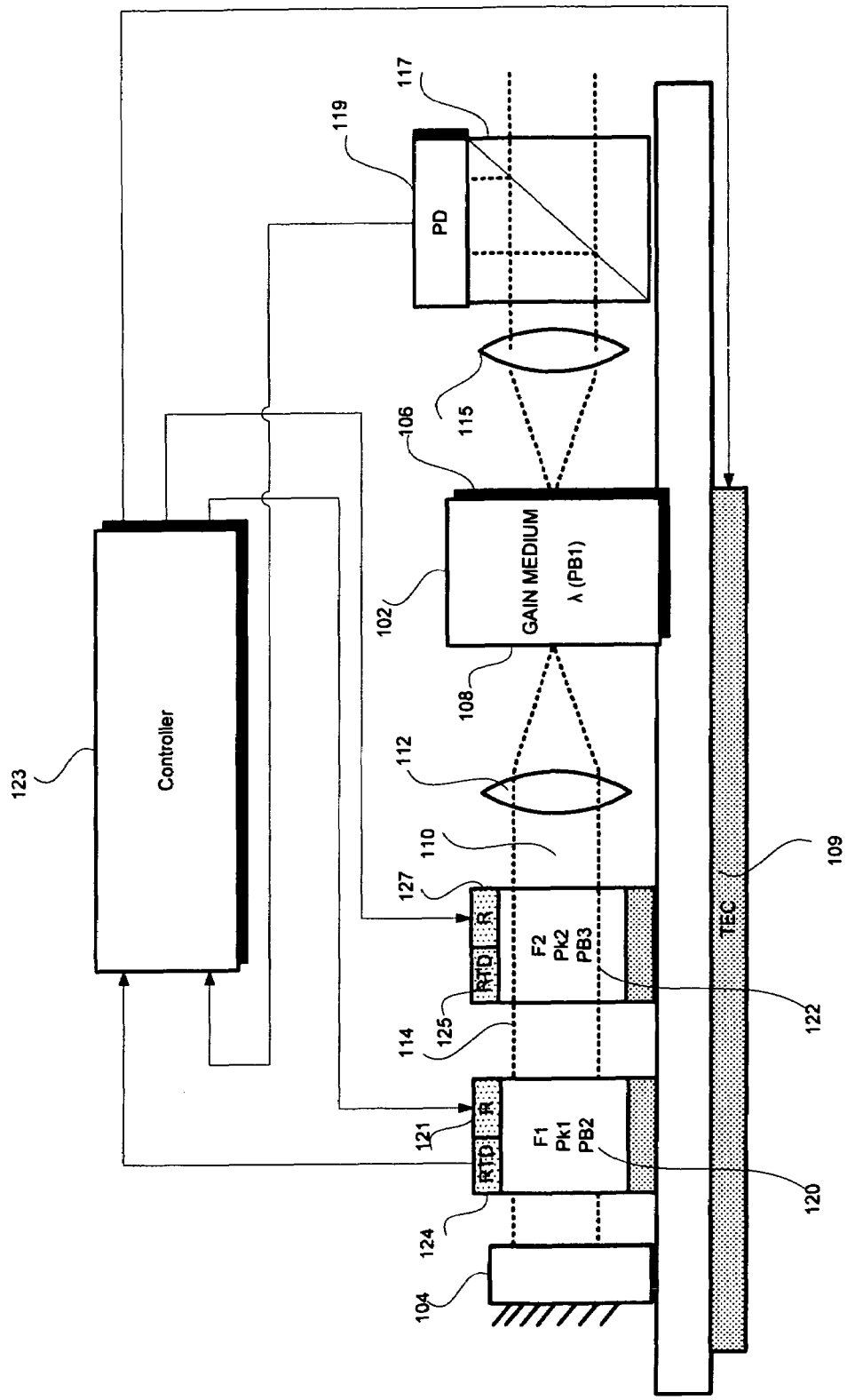
FIG. 1 is a simplified schematic diagram of a tunable external cavity laser according to an embodiment of the present invention.

FIG. 1 is a simplified schematic diagram of a tunable external cavity laser 100 according to an embodiment of the present invention. In the illustrated embodiment, the laser 100 includes a gain medium 102 and a reflective element 104 (hereinafter end mirror 104). The gain medium 102 may be a conventional Fabry-Perot diode emitter chip having an anti-reflection (AR) coated front facet 106 and a partially reflective rear facet 108. The rear facet 108 and the end mirror 104 may define an external cavity 110 for the laser 100.

The gain medium 102 may emit a coherent light beam having a wavelength λ (PB1) from the front facet 106 that may be collimated by a lens 112 to define an optical path 114 that is co-linear with the optical axis of the external cavity 110. Front and rear facets 106 and 108, respectively, of the gain medium 102 may be aligned with the optical axis of the external cavity 110 as well. Light reflected from the end mirror 104 may be fed back along the optical path 114 into the gain medium 102.

Light emitted by the front facet 106 may be collected by an output collimating lens 115 and transmitted through partial reflector 117. The light reflected by the partial reflector 117 may be detected by a photodiode 119. The light transmitted by the partial reflector 117 may encounter additional optics (not shown) to couple light into an optical fiber (not shown).

A thermal-electric cooler (TEC) 109 is operationally coupled to the gain medium 102.

Also in the illustrated embodiment, a filter 120 is disposed in the external cavity 110 between the gain medium 102 and the end mirror 104. In one embodiment, the filter 120 may be a grid generator element that operates as an interference filter that gives rise to a multiplicity of transmission maxima within the communication band of the laser 100. The filter 120 may include a Fabry-Perot interferometer or etalon, a liquid crystal layer responding through the electro-optic effect proportionately to an applied voltage, or other suitable tunable filter. Operationally coupled to the filter 120 are an actuator and a temperature sensor 124. The actuator 121 may be a resistive heater, an electro-optic actuator, or other suitable transducer and/or actuator. The temperature sensor 124 may be a resistive temperature detector (RTD), a thermistor, a thermo-electric cooler (TEC), or other suitable temperature sensor. Actual temperatures of the filter 120 may be determined during operation of the laser 100 using the temperatures provided from the temperature sensor 124

A filter 122 also is disposed in the external cavity 110 between the gain medium 102 and the end mirror 104. The filter 122 may define one or more pass bands to select a laser operating channel from among multiple communication channels. The free spectral range of the filter 122 may correspond to the complete wavelength range of the filter 122 so that a single loss minimum within the communications band can be tuned across the wavelength grid.

In an alternative embodiment, in a Vernier configuration, for example, the free spectral range of filter 122 may be chosen such that filter 122 has one less transmission peak than filter 120 in the wavelength tuning range of the filters. The selected channel, or transmission peaks, of the filters 120 and 122 may be the pair of transmission peaks with the maximum joint transmission (or transmission product). The combined feedback to the gain medium 102 from the filters 120 and 122 may support lasing at a single wavelength within the selected channel. The filter 122 may include a Fabry-Perot interferometer or etalon, a liquid crystal layer, or other suitable tunable filter.

A temperature sensor 125 and an actuator 127 are operationally coupled to the filter 122. The temperature sensor 125 may be a resistive temperature detector (RTD), a thermistor, a thermo-electric cooler (TEC), or other suitable temperature sensor. The actuator 127 may be a resistive heater, an electro-optic actuator, or other suitable transducer and/or actuator.

In the illustrated embodiment, the photodiode 119 is coupled to a controller 123 and the temperature sensor 124 is coupled to the controller 123. The controller 123 is coupled to the thermo-electric cooler 109, the controller 123 is coupled to the actuator 121, and the controller 123 is coupled to the actuator 127. In this embodiment, the controller 123 may control the position of the lasing wavelength of the laser 100 with respect to the transmission peaks of the filters 120 and 122, the wavelength of the transmission peak for filter 120 for the selected channel, and the wavelength of the transmission peak for filter 122 for the selected channel. The controller 123 may control the three wavelengths both relative to one another, and, in reference to the length of a meter.

The controller 123 may apply control logic to the signals from the temperature sensor 124 and the photodiode 119 to generate excitation signals for the actuators 121 and 127, and the thermo-electric cooler 109. For example, the actuator 121 is operationally coupled to the filter 120 so that applying an excitation signal to the filter 120 from the actuator 121 may change the filter 120 characteristics such that the transmission peak of the filter 120 shifts in wavelength. Likewise, the actuator 127 is operationally coupled to the filter 122 so that applying an excitation signal to the filter 122 may change the filter 122 characteristics such that transmission peak of the filter 122 shifts in wavelength. The thermal-electric cooler 109 is thermally coupled to the gain medium 102 so that applying or subtracting heat to the gain medium 102 may change the laser cavity 110 characteristics such that the operational wavelength of the laser changes.

Figure 2:
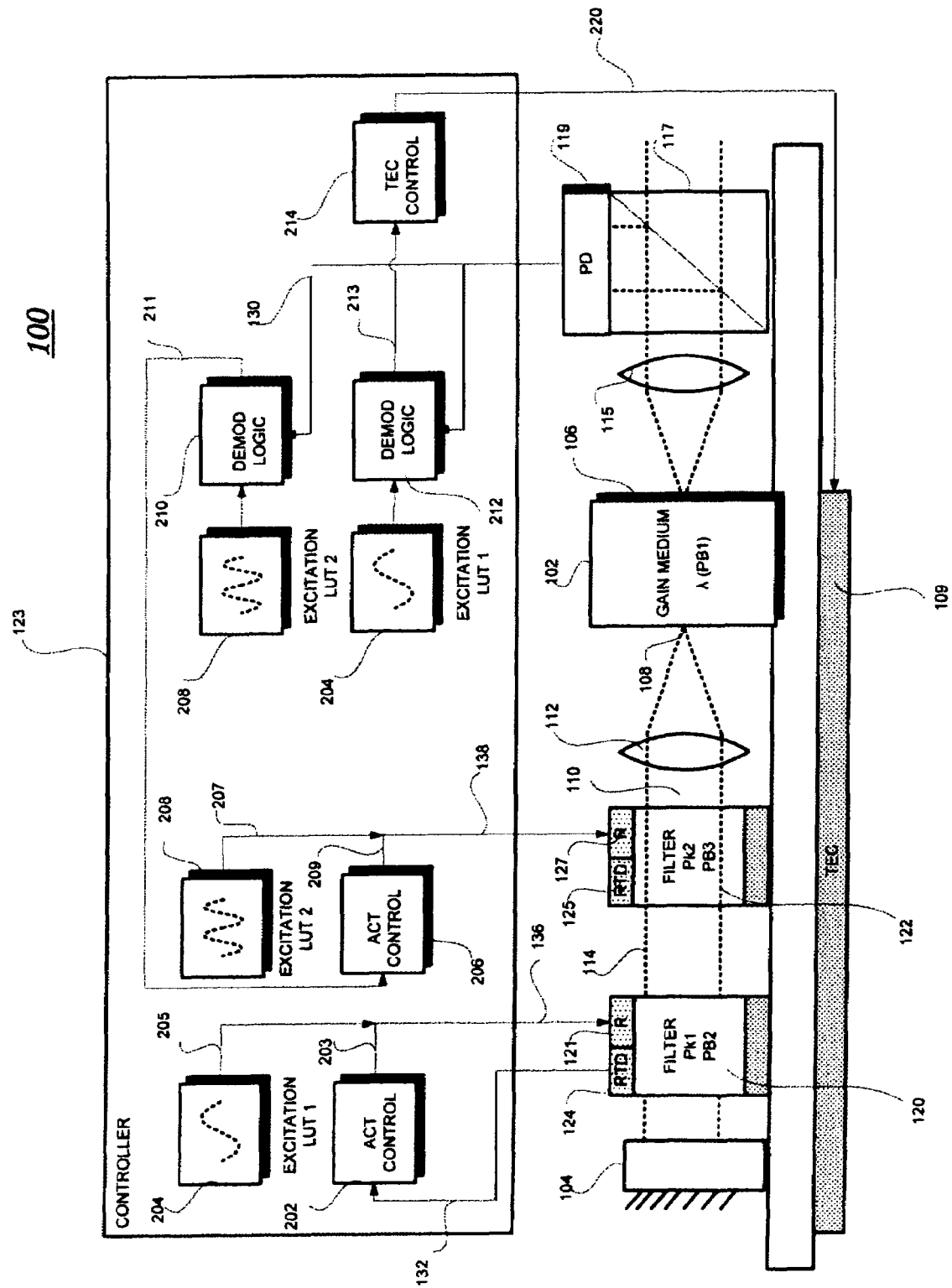
FIG. 2 is a more detailed schematic diagram of the tunable external cavity laser depicted in FIG. 1 according to an embodiment of the present invention.

FIG. 2 is a more detailed schematic diagram of the tunable external cavity laser 100 according to an embodiment of the present invention. In the illustrated embodiment, the controller 123 includes an actuator controller 202 for the filter 120 coupled to the temperature sensor 124 and the actuator 121. An excitation lookup table (LUT) 204 is also coupled to the temperature controller 202 and the actuator 121. In one embodiment, the actuator controller 202 may be a proportional-integral-derivative (PID) controller.

The controller 123 also includes an actuator controller 206 for the filter 122 coupled to the actuator 127. An excitation lookup table (LUT) 208 also is coupled to the actuator controller 206 and the actuator 127.

The illustrated controller 123 further includes demodulation logic 210 coupled to the excitation lookup table (LUT) 208 and the photodetector 119. For some embodiments, the actuator controller 206 may be a proportional-integral-derivative (PID) controller, but other controllers may be suitable.

The example excitation lookup table (LUT) 204 also is coupled to demodulation logic 212, which is coupled to the photodetector 119 and to a temperature controller 214. The actuator controller 202 may implement the same or different technology than the actuator controller 206.

The filter 120 may be controlled to a predetermined temperature, and the temperature of the gain medium 102 and the temperature of the filter 122 may be controlled such that the lasing wavelength and the filter 122 transmission peak overlap with the filter 120 transmission peak. The temperature of filter 120 may be predetermined, for example, in a previously performed calibration procedure that has determined the temperatures of the filter 120 that place a transmission peak of the filter 120 to each wavelength in the tuning range addressed by the filters 120 and filter 122. Given a wavelength in this tuning range, a temperature can then be determined that places a filter 120 transmission peak at that given wavelength.

By controlling the filter 122 transmission peak to coincide with the filter 120 transmission peak, the joint transmission peak through both filters 120 and 122 may align with the filter 120 transmission peak. By simultaneously controlling the lasing wavelength to coincide with the filter 120 transmission peak, the lasing wavelength may be controlled to the given wavelength. Since the laser 100 operates on the optical mode with the lowest loss in the optical cavity 110, aligning the wavelength of the optical mode that is lasing to the joint transmission peak favors the optical mode with the lowest loss in the optical cavity 110 over other possible lasing modes. The stability of the laser 100 may thus be improved.

The filter 120 mean temperature may be controlled by the actuator controller 202. The temperature sensor 124 may sense a signal indicative of the temperature of the filter 120. In an embodiment in which the actuator controller 202 may be a PID controller, the actuator controller 202 may receive the signal from the temperature sensor 124, convert the signal to a temperature, compare the sensed temperature to the predetermined temperature for the filter 120, and generate a temperature error between the sensed temperature for the filter 120 and the predetermined temperature for the filter 120. The temperature controller 202 may run the temperature error through a PID servo control algorithm and output a control value that is converted into a drive voltage 203.

The excitation LUT 204 outputs a dither signal 205. The frequency of the dither signal 205 may be outside the closed loop bandwidth of the temperature controller 202 and therefore may not substantially affect the operation of the controller 202 as previously described. The dither signal 205 may be converted to a voltage 207 represented by the equation, $V_{Dither} \cdot \sin(\omega t)$, and AC coupled to the temperature controller 202 output voltage 203, giving $V_{PID}+V_{Dither} \cdot \sin(\omega t)$, where $V_{Dither}$ is the amplitude of the dither signal 205, $\omega$ is the frequency of the modulated signal applied to the actuator 121, and $V_{PID}$ is the amplitude of the bias signal applied to the actuator 121. In embodiments in which the actuator 121 is a resistive actuator, the temperature dither amplitude may be proportional to the heating dither amplitude, which itself may be proportional to the square of the voltage, V, applied to the actuator 121. The temperature dither amplitude is thus proportional to $$V^2 = (V_{PID}^2 + V_{Dither}^2/2) + V_{Dither} \cdot V_{PID} \cdot \sin(\omega t) - V_{Dither}^2 \cdot \cos(2\omega t).$$

For some embodiments in which each filter 120 and 122 has its own dither applied, one dither is at one frequency and the other dither is at another frequency. Alternatively, one dither is orthogonal to or independent of the other dither. For example, one dither may be a sine and the other dither a cosine.

When the dither is applied to the actuator 121 and the actuator 121 may be a resistive heater, a modulation temperature $\Delta T$ may be applied to the filter 120. The modulation temperature $\Delta T$ can be characterized by $$\Delta T = R_{th} \cdot V^2/R_e, \quad V = V_{DC} + V_{AC} \cdot \sin(\omega t),$$

and $$V^2 = (V_{DC}^2 + V_{AC}^2/2) + V_{DC} \cdot V_{AC} \cdot \sin(\omega t) - V_{AC}^2 \cdot \cos(\omega t),$$

where $V_{AC}$ is the amplitude of the modulated voltage applied to the actuator 121, $V_{DC}$ is the amplitude of the bias voltage applied to the actuator 121, $R_{th}$ is the thermal resistance of the filter 120, $R_e$ is the electrical resistance of the actuator 121, and $\Delta T$ is the modulation temperature for the actuator 121. Modulating the temperature on the filter 120 modulates the transmission peak of the filter 120 to cause the transmission peak of the filter 120 to lock onto the transmission peak of the filter 122 while the transmission peak of the filter 122 remains substantially constant.

The controller 123 may control the lasing wavelength to coincide with the filter 120 peak transmission mean wavelength. The temperature dither 205 applied to filter 120 dithers the peak transmission wavelength of filter 120. The laser 100 output power is a maximum when the lasing wavelength corresponds to the peak transmission wavelength of filter 120 and the output power is reduced nearly proportionately to the reduction in transmission on either side of the peak transmission wavelength of filter 120. This output power modulation is detected by the photodiode (PD) 119. The demodulation logic 210 demodulates the photodiode 119 signal using the excitation LUT 204 to produce an error signal 213 proportional to the wavelength difference of the laser wavelength and peak transmission wavelength of the filter 120. The demodulation logic 210 computes the inner product of excitation LUT 204 and the sampled photodiode 119 output. The error signal 213 is fed into the TEC controller 214, which may zero the error signal 213 and output a TEC drive voltage 220 to adjust the wavelength difference between the lasing wavelength and peak transmission wavelength of the filter 120 to substantially zero.

The controller 123 may control the transmission peak of the filter 122 to coincide with the filter 120 peak transmission mean wavelength For some embodiments, the excitation LUT 208 may output a dither signal 207, which is applied to filter 122. In one embodiment, the dither signal 207 may dither the temperature of the filter 122.

The excitation LUT 208 may be mathematically orthogonal to the excitation LUT 204, meaning that the inner product of the LUT 204 with the LUT 208 equals zero. Sinusoidal signals are orthogonal if they have different frequencies. Sinusoidal signals of the same frequency are also orthogonal if their phase differs by ninety degrees (sine and cosine signals are orthogonal). The dither of the filter 122 may generate an optical power modulation which is superimposed on the optical power modulation from the dither of the filter 120 and detected by the photodiode 119. The condition that the two signals are substantially independent of each other allows demodulator logic 210 for the filter 120 to respond only to the modulation generated by excitation LUT 208 and not to the modulation generated at the frequency or phase quadrature of the excitation LUT 204 for the filter 122.

The error signal 211 generated by demodulator logic 210 is proportional to the difference between the lasing wavelength and the peak transmission of filter 122. The actuator controller 206 may zero this error, making the peak transmission wavelength of the filter 122 substantially equal the lasing wavelength. The error signal 213 generated by demodulator logic 212 is proportional to the difference between the lasing wavelength and the peak transmission of filter 120. The actuator controller 202 may zero this error, making the lasing wavelength substantially equal to peak transmission wavelength of the filter 120. Considering the simultaneous action of TEC controller 109 the peak transmission wavelength of the filters 120 and 122 and the lasing wavelength may substantially coincide.

Alternative embodiments of this invention may include a third filter element driven with a third excitation look up table orthogonal to the first two. The peak transmission wavelength of this third filter may then be aligned with those of the filters 120 and 122 and the lasing wavelength. By extension, N filters may be aligned using these methods. Some of these filters may be inside the lasing cavity 110 and others outside the lasing cavity 110 placed in the optical beam 114 before the optical beam 114 is detected at the photodiode 119 or other optical power sensor.

Figure 3:
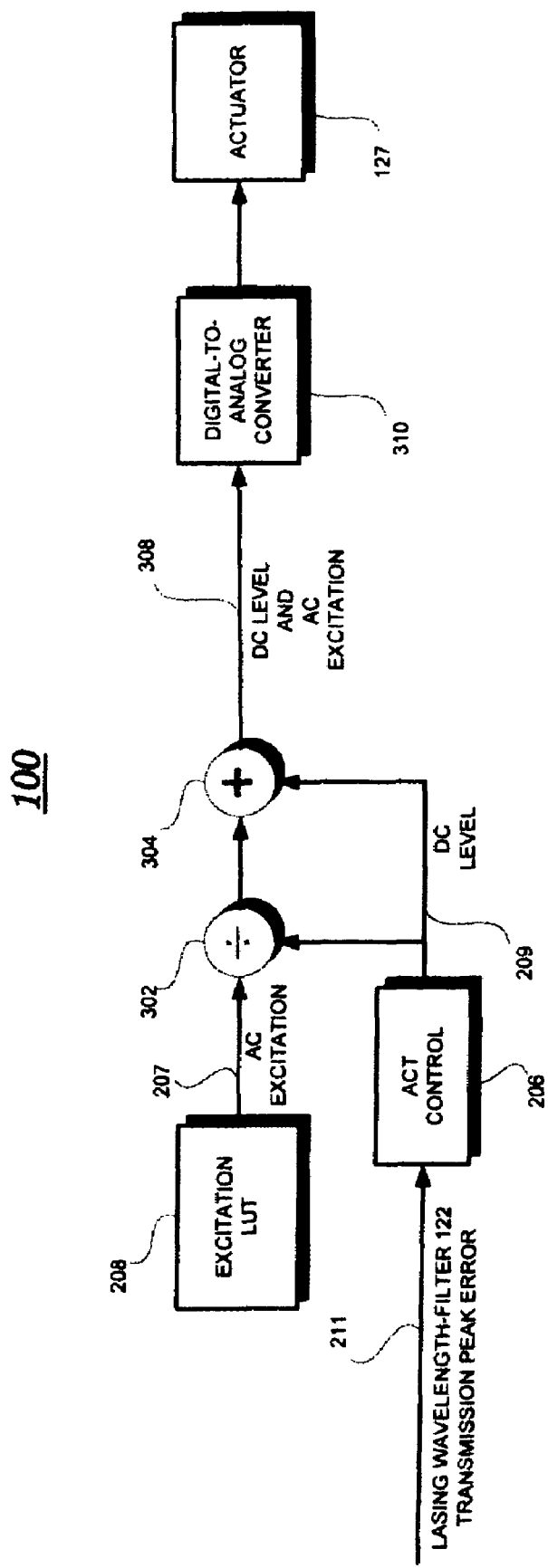
FIG. 3 is a schematic diagram illustrating logic suitable for scaling a control signal according to an embodiment of the present invention.

For some embodiments, to achieve a constant temperature dither, amplitude under various drive conditions, the dither signal may be scaled by the inverse of the actuator controller output, $V_{Dither} \propto 1/V_{PID}$, before being converted to a voltage and AC coupled with the actuator controller voltage. FIG. 3 is a schematic diagram illustrating logic suitable for scaling the control signal 211 by the inverse of the actuator controller 206 output according to an embodiment of the present invention. In the illustrated embodiment, the excitation LUT 208 and the actuator control 206 are coupled to logic 302 and 304 that scales the dither signal 207 by the inverse of the actuator controller 206 output 209 to compensate for the nonlinear response of the actuator 127 to the bias voltage 209.

A normalized signal 308 may be a modulated excitation signal riding on a bias voltage. The normalized signal 308 is converted from a digital signal to an analog signal using the digital-to-analog controller (DAC) 310 and applied to the actuator 127. In this embodiment, the actuator 127 may be a resistive heater.

Recall from above that according to embodiments of the present invention, the transmission peaks of the tunable elements in the laser 100 lock onto or align with each other and that the wavelength of the gain medium 102 locks onto or aligns with the locked tunable element transmission peaks. For some embodiments of the present invention, the transmission peak Pk1 of the filter 120 and the transmission peak Pk2 of the filter 122 lock onto or align with each other and/or the wavelength λ (lasing mode) of the gain medium 102 locks onto or aligns with the locked Pk1 and Pk2. FIG. 4 is a graphical representation illustrating the pass band relationship of the filter 120 (PB2), filter 122 (PB3), and the external cavity 110 (PB1) according to an embodiment of the present invention. Relative transmission is shown on the vertical axis and wavelength on the horizontal axis. As can be seen, free spectral range of the filter 122 is greater than the free spectral range of the filter 120, which in turn is greater than the free spectral range of the external cavity 110. In the illustrated embodiment, PB1 may be the transmission peaks representative of the lasing modes of the gain medium 102, PB2 may be the transmission peaks representative of the channels generated by the filter 122, and PB3 may be the transmission peak representative of the grid generated by the filter 120.

FIG. 5 is a graphical representation illustrating the filter 120 selecting a lasing mode of the laser 100 according to an embodiment of the present invention. That is, the graphical illustration in FIG. 5 shows PB2 selecting one of the PB1 lasing modes.

FIG. 6 is a graphical representation illustrating the filter 122 selecting a transmission peak (Pk2) from the PB2 generated by the filter 120 according to an embodiment of the present invention. That is, the graphical illustration in FIG. 6 shows PB3 selecting one of the PB2 transmission peaks (Pk1).

Figure 7:
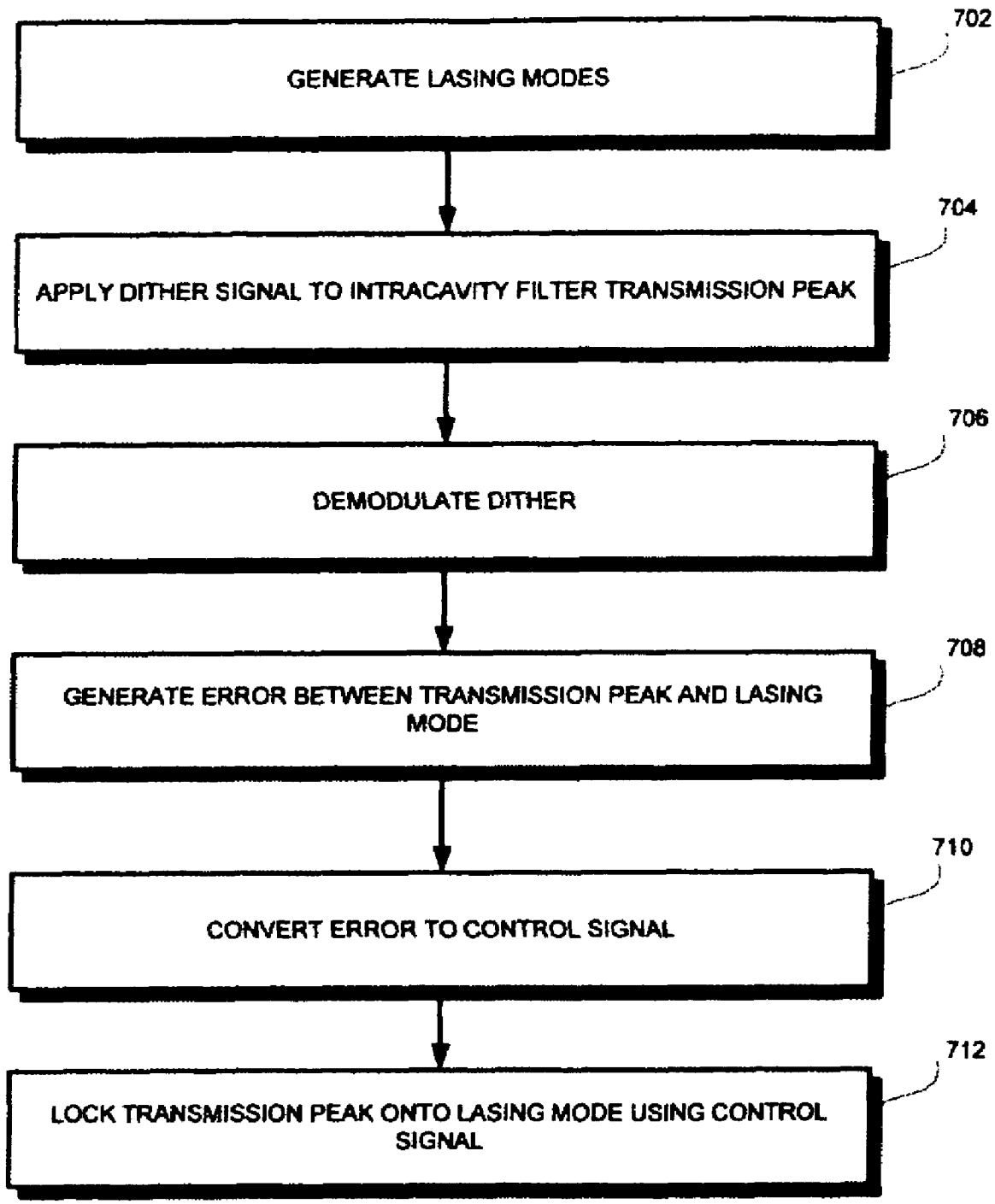
FIG. 7 is a flowchart illustrating a method of dithering a single tuning element positioned in the tunable external cavity laser depicted in FIG. 1 according to an embodiment of the present invention.

FIG. 7 is a flowchart illustrating a method 700 of dithering a single tuning element positioned in an external cavity of a laser to lock the transmission peak of the filter onto the lasing mode of the laser according to an embodiment of the present invention. In block 702, the laser may generate lasing modes. In block 704, an excitation is applied to the tuning element to dither the transmission peak around a lasing mode closest to the transmission peak. In block 706, the dither on the tuning element is demodulated. In block 708, an error between the wavelength of the transmission peak and the lasing mode nearest the transmission peak is generated. In block 710, the error between the lasing mode and the transmission peak is converted to a control signal. In block 712, the control signal is used to lock the transmission peak onto the lasing mode.

Figure 8:
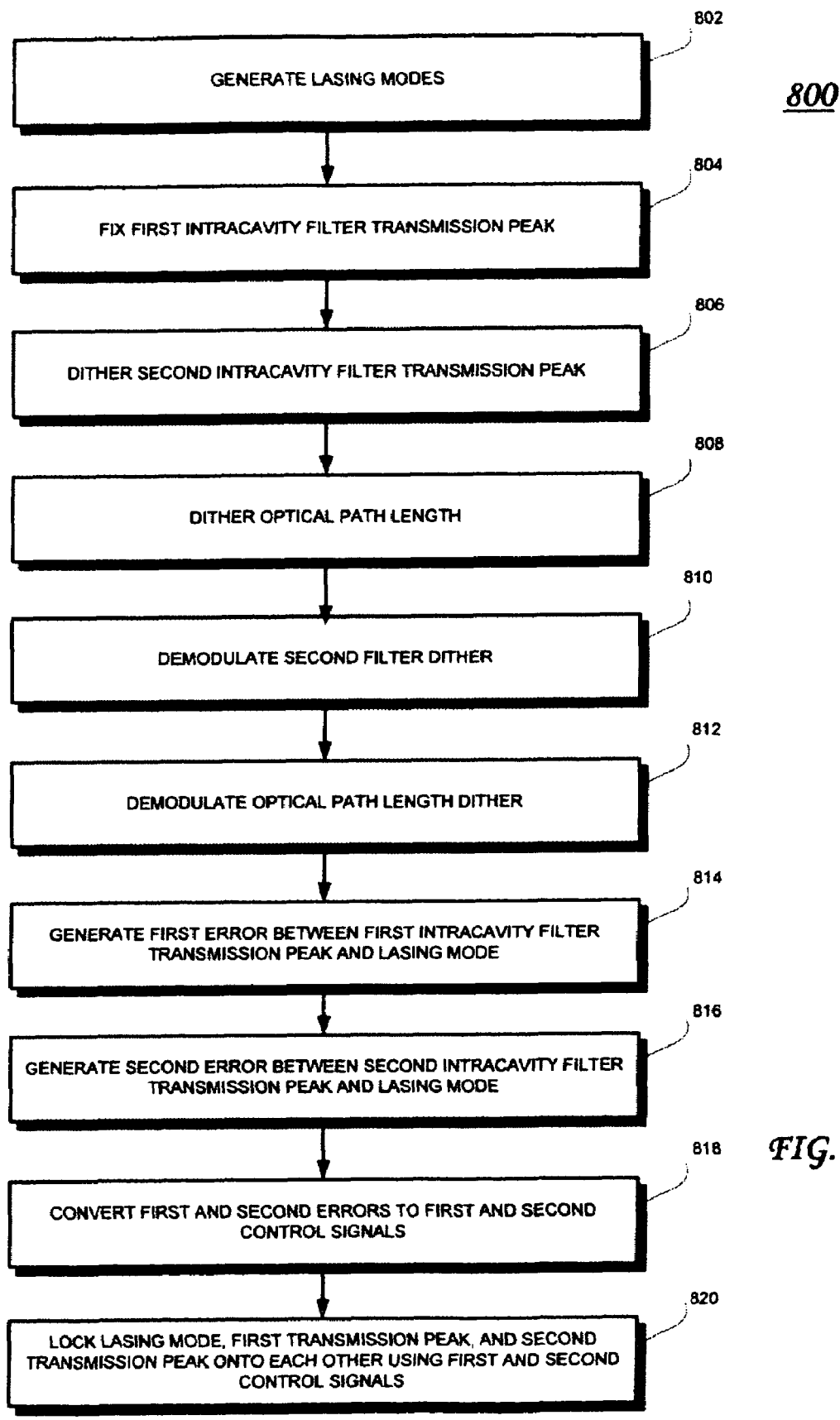
FIG. 8 is a flowchart illustrating a method of maintaining substantially fixed a transmission peak of one tuning element while dithering a second tuning element and the optical path length of the external cavity according to an embodiment of the present invention.

FIG. 8 is a flowchart illustrating a method 800 of maintaining substantially fixed a transmission peak of one tuning element positioned in an external cavity of a laser while dithering a second tuning element and the optical path length of the external cavity according to an embodiment of the present invention. In this embodiment, the transmission peaks of the first and second tuning elements and the lasing mode lock onto each other using two control signals.

In block 802, the laser may generate lasing modes. In block 804, the transmission peak of the first tuning element is fixed at a predetermined wavelength. The target temperatures used to fix the first tuning element wavelength may be determined during laser 100 calibration using the temperatures provided from the actuator 124.

In block 806, an excitation is applied to the second tuning element to dither the transmission peak around a lasing mode closest to the transmission peak of the first tuning element.

In block 808, the optical path length of the laser is dithered. In one embodiment, the wavelength λ of the gain medium 102 may be modulated by applying the dither from the output of the excitation LUT 204 to the TEC 214 to cause the temperature of the end mirror 104 to modulate. Modulating the temperature of the end mirror 104 changes the length of the external cavity 110, which changes the wavelength λ of the gain medium 102. Other suitable wavelength locking techniques may be used.

In a block 810, the dither on the second tuning element is demodulated. In block 812, the dither on the optical path length is demodulated.

In block 814, a first error between the wavelength of the transmission peak of the first tuning element and the lasing mode nearest the transmission peak of the first tuning element is generated. In block 816, a second error between the wavelength of the transmission peak of the second tuning element and the lasing mode nearest the transmission peak of the second tuning element is generated.

In block 818, the first and second errors are converted to two control signals. In block 820, the two control signals are used to lock the transmission peak of the first and second tuning elements and the lasing mode onto each other.

Figure 9:
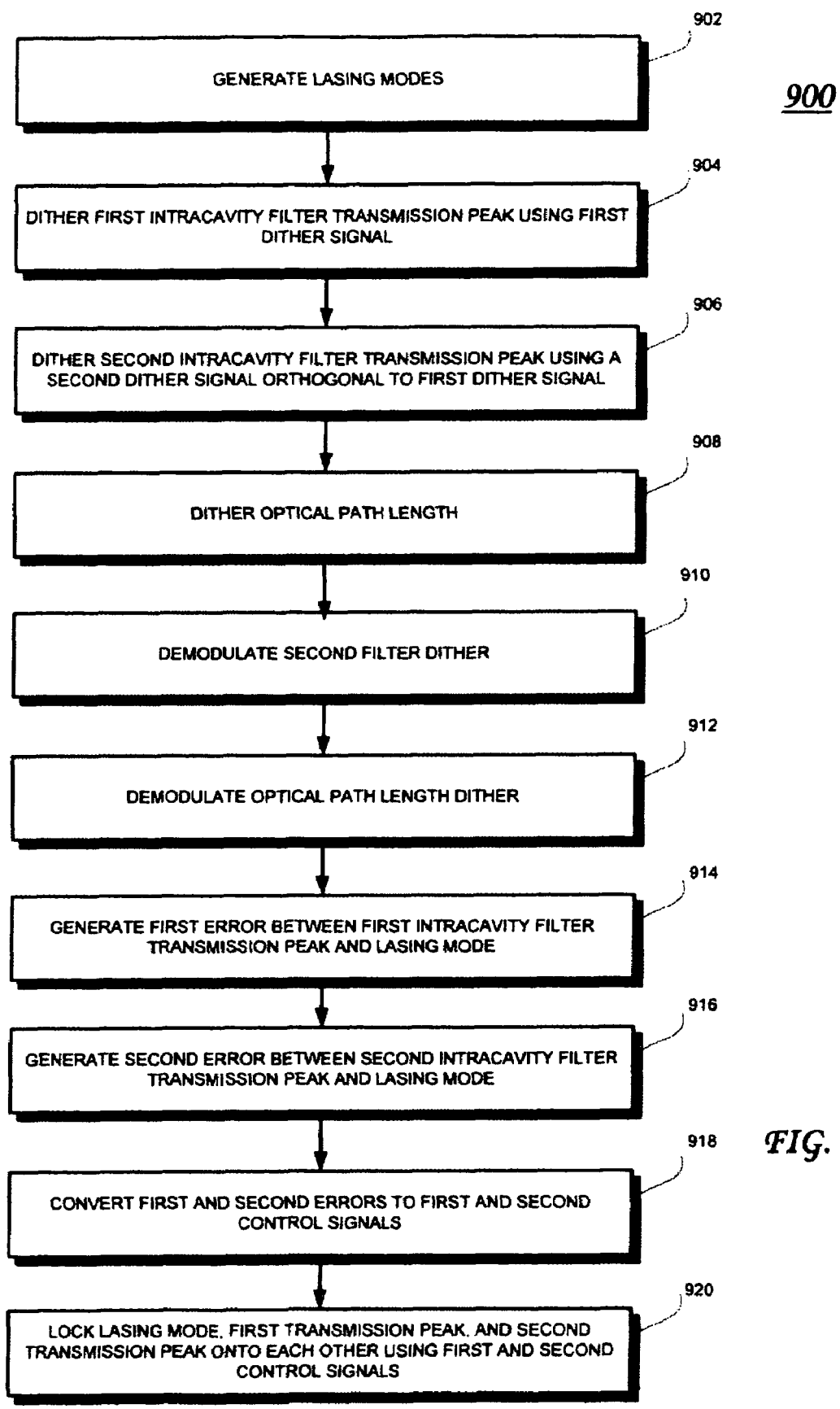
FIG. 9 is a flowchart illustrating a method of dithering a transmission peak of one filter element, dithering a second filter element at a frequency or phase orthogonal to the first filter element, and dithering the optical path length of the external cavity according to an embodiment of the present invention.

FIG. 9 is a flowchart illustrating a method 900 of dithering a transmission peak of one filter element positioned in an external cavity of a laser, dithering a second filter element at a frequency or phase orthogonal to the first filter element, and dithering the optical path length of the external cavity according to an embodiment of the present invention. In this embodiment, the transmission peaks of the first and second filter elements and the lasing mode lock onto each other using two control signals.

In block 902, the laser may generate lasing modes. In block 904, an excitation is applied to the first filter element to dither the transmission peak around a lasing mode closest to the transmission peak of the first filter element. In one embodiment, the excitation may be provided by values included in a first lookup table.

In block 906, an excitation is applied to the second filter element to dither the transmission peak around a lasing mode closest to the transmission peak of the first filter element. In one embodiment, the excitation may be provided by values included in a second lookup table. The values in the first lookup table may be such that the either applied to the first filter element are orthogonal to the dither applied to the second filter element.

In block 908, the optical path length of the laser is dithered as described above, for example. In one embodiment, the excitation may be provided by values included in the first lookup table, the second lookup table, or a third lookup table. In a block 910, the dither on the second filter element is demodulated. In block 912, the dither on the optical path length is demodulated.

In block 914, a first error between the wavelength of the transmission peak of the first filter element and the lasing mode nearest the transmission peak of the first filter element is generated. In block 916, a second error between the wavelength of the transmission peak of the second filter element and the lasing mode nearest the transmission peak of the second filter element is generated. In block 918, the first and second errors are converted to two control signals. In block 920, the two control signals are used to lock the transmission peak of the first and second filter elements and the lasing mode onto each other.

Figure 10:
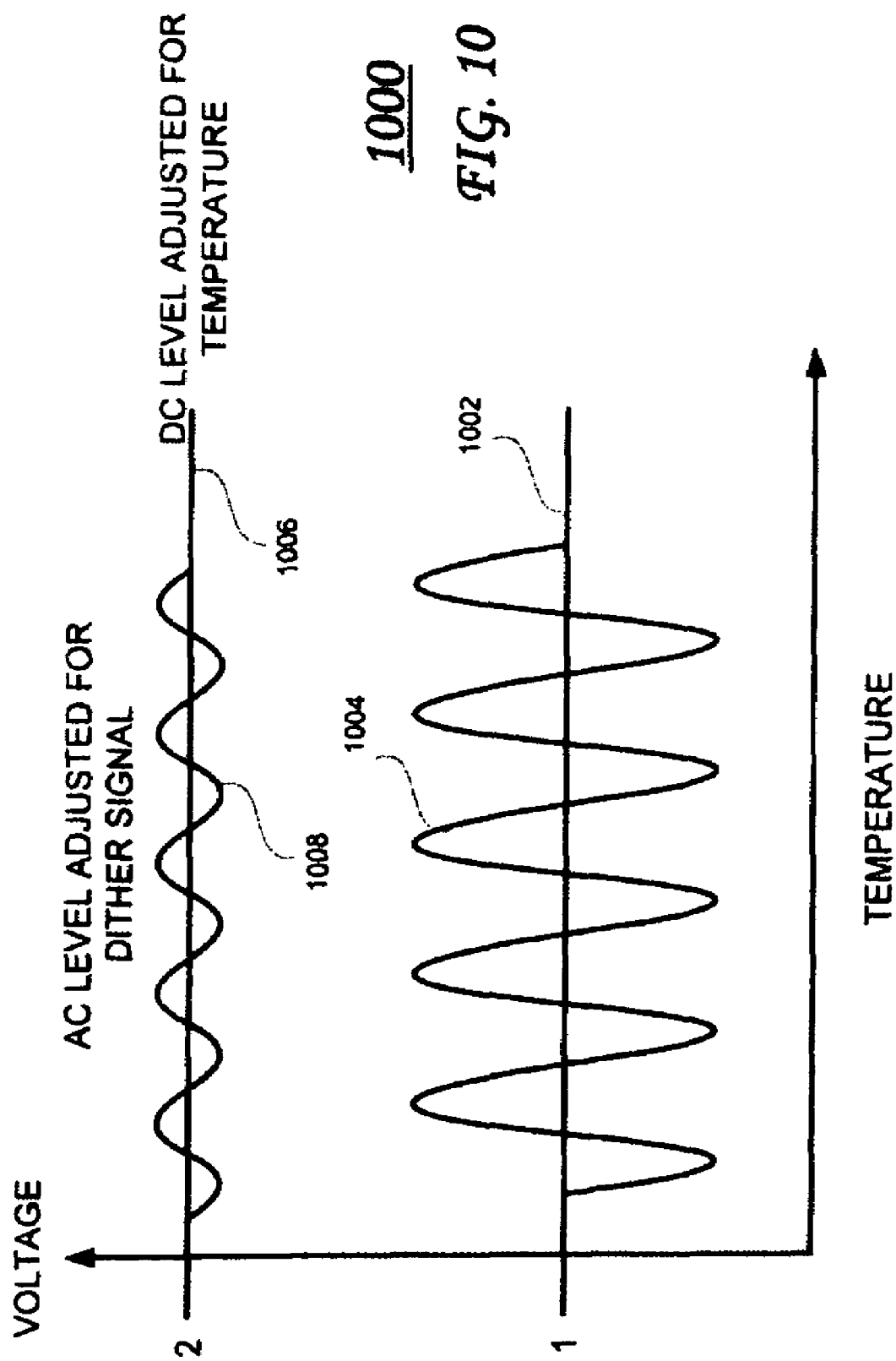
FIG. 10 is a graphical representation illustrating an example dither signal that may be applied to one or more filters according to an embodiment of the present invention.

FIG. 10 is a graphical representation illustrating an example dither signal 1000 that may be applied to the filter 120 and/or 122 according to an embodiment of the present invention. Note that the example dither signal 1000 includes a bias portion 1002 at the illustrated 1 volt DC and a modulated portion 1004 that rides on the bias portion 1002. If the bias voltage is adjusted for temperature, such as in response to changes in power, ambient temperature, or wavelength drift, for example, then the modulated voltage adjusts accordingly. For example, note that if the example bias portion 1002 moves from the illustrated 1VDC to the example bias portion 1006 at 2VDC, then the example modulated portion 1004 moves to the example modulated portion 1008. Note that the corresponding modulated portion is reduced. This is the result of the fact that the modulated portion is proportional to the inverse of the bias voltage and thus as the bias voltage increases, the modulated portion decreases.

Figure 11:
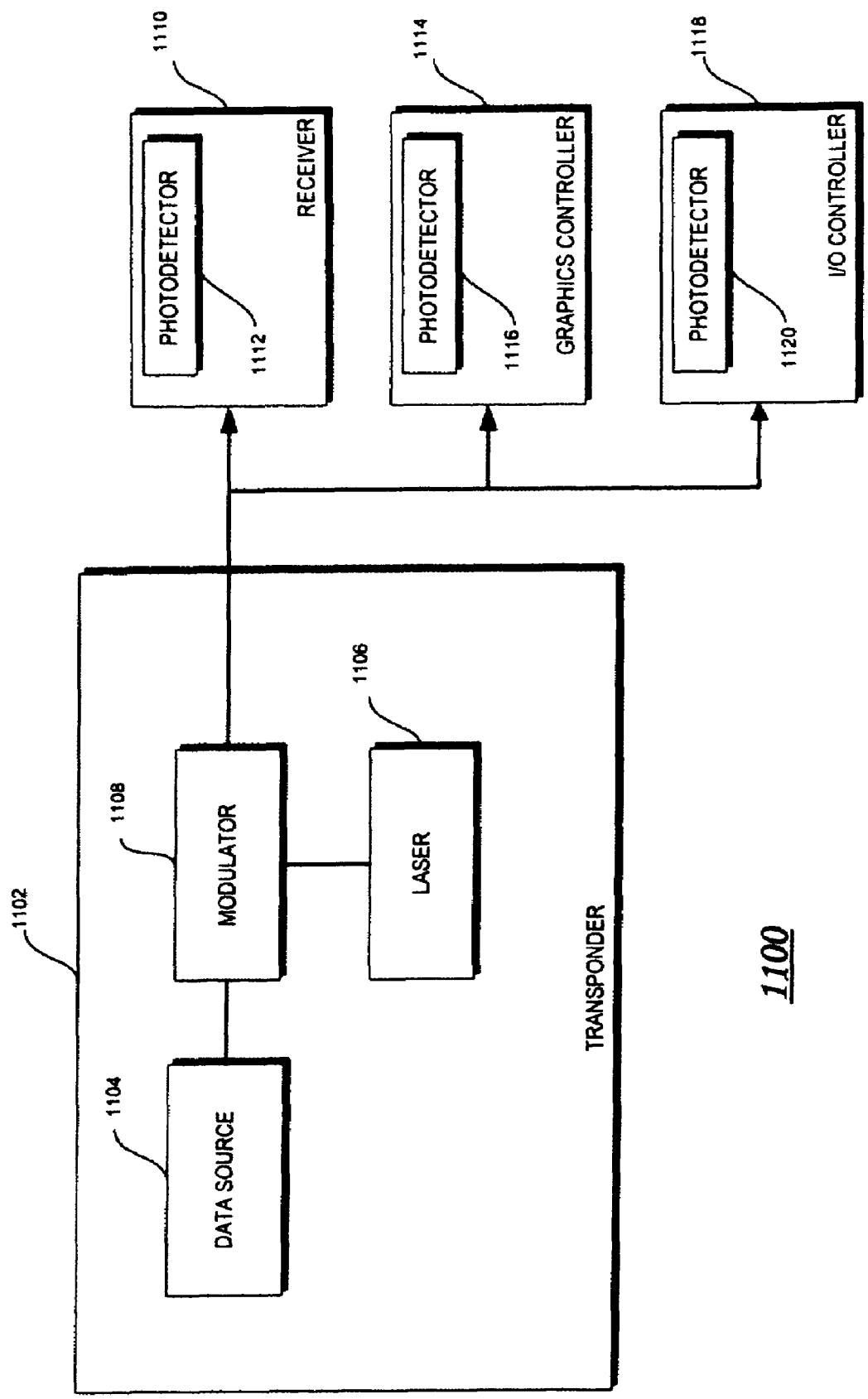
FIG. 11 is a high level block diagram of an optical system according to an embodiment of the present invention.

FIG. 11 is a high level block diagram of an optical system 1100 according to an embodiment of the present invention. In the illustrated embodiment, the system 1100 includes transmitter 1102 coupled to circuitry to receive an optical signal. The illustrated transmitter 1102 includes a data source 1104 coupled to a modulator 1108, which is coupled to a laser 1106. The laser may provide a continuous wave (CW) source of light to the modulator 1108. The data source 1104 may provide a data signal to the modulator 1108, which may convert the electrical data signal from the data source 1104 to an optical signal on the CW light. The optical modulator 1108 may modulate the optical signal to provide a carrier for the optical signal. For some embodiments, the laser 1106 may include the external cavity 100, or other external cavity laser fabricated in accordance with embodiments of the present invention.

The modulated optical signal may be transmitted to a receiver 1110, which may convert the optical signal back to an electrical signal using the photodetector 1112. The receiver 1110 may process the electrical signal.

The modulated optical signal may be transmitted to a graphics controller 1114, which may convert the optical signal back to an electrical signal using the photodetector 1116. The graphics controller 1114 may process the electrical signal which may be commands and data to generate display signals (e.g., in RGB format).

The modulated optical signal may be transmitted to an input/output (I/O) controller 1118, which may convert the optical signal back to an electrical signal using the photodetector 1120. The I/O controller 1110 may process the electrical signal which may be commands and data to control peripheral devices (not shown).

In some embodiments, the transmitter 1102 may be on the same chip as the receiver 1110, the graphics controller 1114, and/or the I/O controller 1118. In other embodiments, the transmitter 1102 may be on the same board as the receiver 1110, the graphics controller 1114, and/or the I/O controller 1118 but on a different chip. In still other embodiments, the transmitter 1102 may be on a different board as the receiver 1110, the graphics controller 1114, and/or the I/O controller 1118.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the embodiments described herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
   an external cavity laser having at least one lasing wavelength, the laser having further:
      a gain medium and an end mirror defining a cavity;
      at least one tuning element disposed in the cavity, the tuning element having at least one transmission peak wavelength; and
      an actuator operationally coupled to the tuning element; and
   logic to apply a dither signal to the tuning element and to generate a control signal from the dither signal, the control signal being representative of an error between the transmission peak wavelength and the lasing wavelength, wherein the actuator is to align the lasing wavelength with the transmission peak wavelength using the control signal.

2. The apparatus of claim 1, wherein the lookup table to store values for the dither signal comprises:
   a sensor to sense a temperature signal representative of a temperature of the tuning element;
   a lookup table to output a dither value for at least one predetermined temperature; and
   an actuator controller operationally coupled to the actuator to:
      convert the temperature signal to a temperature;
      compare the sensed temperature signal to the predetermined temperature value; and
      generate a temperature error signal between the sensed temperature and the predetermined temperature.

3. The apparatus of claim 2, further comprising a photodetector to detect output power modulation of the external cavity laser and to generate a power modulation signal.

4. The apparatus of claim 3, further comprising demodulation logic to demodulate the power modulation signal using the lookup table output value to generate the temperature error signal, wherein the temperature error signal is proportional to the error between the transmission peak wavelength and the lasing wavelength.

5. The apparatus of claim 4, further comprising a controller to adjust the temperature error signal to substantially zero and to output a drive voltage representative of the substantially zeroed temperature error signal.

6. The apparatus of claim 5, further comprising a thermal electric cooler to adjust the temperature of the end mirror using the drive voltage, the end mirror to adjust the wavelength difference between the lasing wavelength and peak transmission wavelength to substantially zero the error signal to substantially zero.

7. The apparatus of claim 6, wherein the tuning element comprises:
   a first filter disposed in the laser cavity, the first filter having a first transmission peak wavelength; and
   a second filter disposed in the laser cavity, the second filter having a second transmission peak wavelength peak, wherein the logic is further to apply the dither signal to the first filter and to generate the control signal from the dither signal, the control signal being representative of an error between the first transmission peak wavelength and the lasing wavelength.

8. The apparatus of claim 7, wherein the logic is further to apply a second dither signal to the second filter and to generate a second control signal from the second dither signal, the second control signal being representative of a second error between the second transmission peak wavelength and the lasing wavelength.

9. The apparatus of claim 8, further comprising:
   a second lookup table to output a second dither value for a second predetermined temperature; and
   second demodulator logic to demodulate the power modulation signal using the second lookup table output value to generate a second temperature error signal, wherein the second temperature error signal is proportional to the error between the second transmission peak wavelength and the lasing wavelength.

10. The apparatus of claim 8, wherein the first dither signal is orthogonal to the second dither signal.

11. The apparatus of claim 8, wherein the first dither signal is non-orthogonal to the second dither signal.

12. A method, comprising:

generating lasing modes for an external cavity laser, the external cavity laser having at least one lasing wavelength, a gain medium and an end mirror defining a cavity, and at least one tuning element disposed in the cavity, the tuning element having at least one transmission peak wavelength;

applying a dither signal to the tuning element;

generating a control signal from the dither signal, the control signal being representative of an error between the transmission peak wavelength and the lasing wavelength; and aligning the lasing wavelength with the transmission peak wavelength using the control signal.

13. The method of claim 12, further comprising:

applying a second dither signal to a second filter disposed in the laser cavity, the second filter having a second transmission peak wavelength peak;

generating a second control signal from the second dither signal, the second control signal being representative of a second error between the second transmission peak wavelength and the lasing wavelength.

14. The method of claim 12, further comprising:

applying a second dither signal orthogonal to the first dither signal to a second filter disposed in the laser cavity, the second filter having a second transmission peak wavelength peak;

generating a second control signal from the second dither signal, the second control signal being representative of a second error between the second transmission peak wavelength and the lasing wavelength.

15. The method of claim 12, further comprising:

generating a modulated voltage signal;

generating the control signal from the modulated voltage signal;

generating a bias voltage signal from the control signal;

scaling the modulated voltage signal by an inverse of the bias voltage signal; and applying the scaled modulated voltage signal to the tuning element.

16. A system, comprising:

an external cavity laser to emit an optical signal, the laser having at least one lasing wavelength, a gain medium and an end mirror defining a cavity, at least one tuning element disposed in the cavity, the tuning element having at least one transmission peak wavelength, and an actuator operationally coupled to the tuning element;

logic to apply a dither signal to the tuning element and to generate a control signal from the dither signal, the control signal being representative of an error between the transmission peak wavelength and the lasing wavelength, wherein the actuator is to align the lasing wavelength with the transmission peak wavelength using the control signal; and a receiver having a photodetector to receive the optical signal from the external cavity laser.

17. The system of claim 16, wherein the tuning element comprises:

a first filter disposed in the laser cavity, the first filter having a first transmission peak wavelength; and a second filter disposed in the laser cavity, the second filter having a second transmission peak wavelength peak, wherein the logic is further to apply the dither signal to the first filter and to generate the control signal from the dither signal, the control signal being representative of an error between the first transmission peak wavelength and the lasing wavelength.

18. The system of claim 17, wherein the logic is further to apply a second dither signal to the second filter and to generate a second control signal from the second dither signal, the second control signal being representative of a second error between the second transmission peak wavelength and the lasing wavelength.

* * * * *